US010403666B2

(12) United States Patent
Mokhnatyuk

(10) Patent No.: US 10,403,666 B2
(45) Date of Patent: Sep. 3, 2019

(54) IMAGING DEVICE WITH COLOR PIXELS AND METHOD OF LIGHT COLOR TAPERING AND DETECTION INSIDE PIXEL

(71) Applicant: Alexander Mokhnatyuk, Santa Barbara, CA (US)

(72) Inventor: Alexander Mokhnatyuk, Santa Barbara, CA (US)

( * ) Notice: Subject to any disclaimer, the term of this patent is extended or adjusted under 35 U.S.C. 154(b) by 134 days.

(21) Appl. No.: 15/598,083

(22) Filed: May 17, 2017

(65) Prior Publication Data

US 2018/0337207 A1 Nov. 22, 2018

(51) Int. Cl.
*H01L 27/00* (2006.01)
*H01L 27/146* (2006.01)

(52) U.S. Cl.
CPC .. *H01L 27/14625* (2013.01); *H01L 27/14627* (2013.01); *H01L 27/14629* (2013.01); *H01L 27/14645* (2013.01)

(58) Field of Classification Search
CPC ......... H01L 27/14625; H01L 27/14627; H01L 27/14629; H01L 27/14645
USPC ........................................... 250/208.1, 214.1
See application file for complete search history.

(56) References Cited

U.S. PATENT DOCUMENTS

2010/0116976 A1\* 5/2010 Wober .................. B82Y 20/00
250/227.23

\* cited by examiner

*Primary Examiner* — Kevin K Pyo

(57) ABSTRACT

Image sensor device includes color pixel array without color filter array. Method of color separation is based on tapering of light selectively depending on wavelength into photodetectors inside pixel. Light is directed into light guide along semiconductor surface with color selective structures and photodetectors in each pixel used to collect each light color component separately. This approach and horizontal geometry of light guide have numerous advantages, for example for the CMOS fabrication process, and allow multiple ways for detail engineering of light color components separation and detection.

5 Claims, 6 Drawing Sheets

IMAGING DEVICE WITH COLOR PIXELS AND METHOD OF LIGHT COLOR TAPERING AND DETECTION INSIDE PIXEL

CROROSS-REFERENCE TO RELATED APPLICATIONS

Not Applicable.

U.S. Patent Documents

U.S. Pat. No. 5,965,875 Color separation in an active pixel cell imaging array using a triple-well structure, October 1999, Merrill
U.S. Pat. No. 7,646,943 Optical waveguides in image sensors, January 2010, Wober
U.S. Pat. No. 0,116,976 Vertical waveguides with various functionality on integrated circuits, May 2010, Wober
U.S. Pat. No. 8,229,255 Optical waveguides in image sensors, July 2012, Wober
U.S. Pat. No. 8,748,799 Full color single pixel including doublet or quadruplet Si nanowires for image sensors, June 2014, Wober
U.S. Pat. No. 8,885,987 Photonic via waveguide for pixel arrays, November 2014, Augusto
U.S. Pat. No. 9,429,723 Optical waveguides in image sensors, August 2016, Wober
U.S. Pat. No. 9,581,762 Pixel structure using a tapered core waveguide, image sensors and camera using same, February 2017, Wertsberger

Foreign Patent Documents

KR20100109400 (A)—2010 Oct. 8 Solid State Image Pickup Device, Method Of Manufacturing The Same, Image Pickup Device, And Electronic Device, October 2010, Nakata Masashi [JP]; Izawa Shinichiro [JP]; Yamashita Kazuyoshi [JP]

Other References

1. Image sensors and signal processing for digital still cameras. Ed. By Junichi Nakamura. 2005.
2. Microoptics, $2^{nd}$ Edition. Stefan Sinzinger, Jurgen Jahns. 2003

BACKGROUND OF THE INVENTION

1. Field of the Invention

Present invention relates to image sensors with micro-lenses and, in particular, to color image sensors and methods of light color components separation and detection in sensor pixel array.

2. Discussion of Related Art

Semiconductor image sensors architecture varies significantly depending on the field of application. Typically image sensor includes pixel array where each pixel generates electrical response on incident optical input, the input light wavelength is located in specified range of pixel sensitivity. Usually CFA is used in image sensors in such way that each pixel responds to certain light color (see other references 1, 2). CFA is used to filter all incident light except small range of wavelength where light transmitted and detected. Therefore, responsivity of such sensors decreased significantly because of CFA filtration.

Image sensor pixels without CFA in prior art might exploit numerous methods to detect light color components. A digital imager claimed in U.S. Pat. No. 5,965,875 uses for color separation the difference of absorption depth in silicon of the light of various wavelengths. Light color separation is happening during light detection, because color photo-sensing structure is formed vertically at a depth in the silicon substrate, and light absorption on different depth allows to distinguish colors.

There are numerous ways how waveguides utilized inside pixel in the prior art. Different sources use different terms to name them, such as light wires, pipes, tunnels or photonic vias. These waveguides are vertically oriented. Light passes into them without re-direction, usually micro-lens is used to focus light into such pipes.

U.S. Pat. Nos. 7,646,943, 8,229,255, 9,429,723 and JP patent KR20100109400—2010 Oct. 8 describe optical waveguide(s) located inside pixel vertically where light enters as it focused by micro-lens or passed optical coupler. CFA is suggested to use in some of such geometries to achieve good color reproduction. Additional variations under consideration are usage of multiple waveguides to improve color reproduction; usage a pair of photosensitive elements located around each waveguide.

U.S. Pat. No. 8,748,799 describes using vertically oriented nano-wires to achieve color sensitivity, optical parameters of such nano-wires are color dependent.

U.S. Pat. No. 8,885,987 describes light tunnels inside pixel, formed as vertical vias used for color separation.

U.S. Pat. No. 9,581,762 describes special tapering of vertical waveguide, such waveguide shape allows color separation and detection by placing plurality of photodetectors receiving color light.

Similar U.S. Pat. Nos. 9,581,762, 0,116,976, 9,429,723 disclose the use of tapered waveguide for light color components separation, but they do not disclose that light tapering and color components separation is performed in each pixel in horizontally located light guide where light is focused by claimed micro-lens and directed by claimed optical entry element.

It would not have been obvious for someone with ordinary skill in the art to modify the devices claimed in referenced patents to utilize a micro-lens, an entry element, a light guide, and a multiple photodetectors in the manner recited in claim 1.

SUMMARY OF THE INVENTION

Invention presents image sensor comprising color pixels with tapering of light of selected colors into correspondent photodetectors. Described herein are imaging method of light color components separation and detection inside pixel and imaging device with such color pixels. Color pixels are designed without Color Filter Array (CFA) which is commonly used in image sensor industry. Avoiding CFA allows essentially increase sensor summary quantum efficiency (QE) because CFA absorbs all light colors except target color, therefore degrading total QE.

Light tapering including color separation is performed in each pixel in horizontally located light guide where light is focused by micro-lens and directed by means of specially architected optical entry element such as tilted mirror. This approach and horizontal geometry of light guide have numerous advantages for the CMOS fabrication process technology and allow multiple ways of detail engineering light color separation and detection. Horizontal or tilted top surface of said light guide is covered by metal to reflect light back to light guide and confine it below metal surface. The light guide is illustrated in several embodiments including description of multilayer structures in the vicinity of semiconductor surface.

DETAILED DESCRIPTION OF THE DISCLOSURE

To collect light in the pixel photodetector the common approach is to use micro-lenses which focus light inside small area of pixel. Then, instead of be detected immediately, light is directed to the light guide oriented along the semiconductor substrate surface as displayed on FIG. 1, this light guide is used to perform color separation and tapering light into photodetectors.

Figure 1:
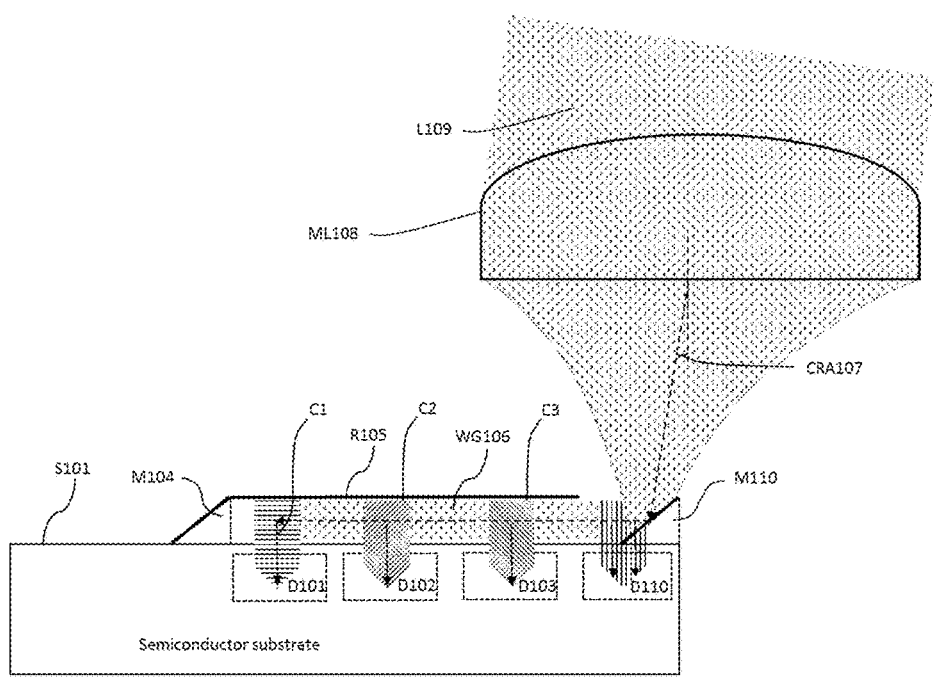
FIG. 1. Embodiment of Color pixel with micro-lens ML108 focusing incident light L109 and directing into light guide WG106. Incident light chief ray angle is CRA107. Light guide top metal surface is R105 and bottom semiconductor surface is S101. C1, C2, C3 denotes different light colors. D101, D102, D103, and D110 are photodetectors. M110 is light guide entry element, and M304 is light guide entry element of the next pixel.

As shown on FIG. 1, after passing micro-lens ML108 with chief ray angle CRA107 light gets onto the light guide entry element M110. The purpose and main function of this light guide entry element M110 is to change direction of light propagation and fit focused light into the light guide. The other purpose of entry element M110 is to provide transmittance some pre-defined portion of incident light into semiconductor volume where "integral" photodetector D110 is located. This detector is used to measure total light energy integral for all wavelengths (colors). Such geometry with single focusing spot where total light energy is measured by D110 photodetector is used to reduce image color aliasing because all color detectors measure incident light energy tapered from the same spot of the image. The portion of light transmitted into detector D110 is determined by physical architecture of entry element M110, geometry and spectrum of incident light. Micro-lens ML108 could have commonly used spherical or parabolic profile. Besides, micro-lens might be designed in cylindrical symmetry, and this is the way to fit focused light to the width of light guide and width of the light entry element. The general rule for designing micro-lens, light guide and entry element is to make them complementary to each other, so that all geometrical parameters like width, length, and depth are correspondent to each other and relate to micro-lens radius x- and y-directions.

Light guide entry element M110 physical embodiment might be various, it depends on light wavelength, semiconductor materials, manufacturing process, and others. Schematically in this disclosure the Light guide entry element is shown as tilted mirror used to direct light into light guide.

Compared to existing art color perception in pixels (see for example U.S. Pat. Nos. 5,965,875, 9,581,762), light guide entry element M110 changes direction of light in such way that it starts propagating horizontally along the surface of semiconductor before light color components separation. Positioning light guide horizontally along semiconductor surface allows separate light color components in the much more manageable manner compared to light separation in "vertical" light propagation geometry, because in fabrication process, for instance CMOS process, it is expected each layer to be deposited horizontally. Further in this disclosure we show examples see FIG. 2-6) of various light guide architecture used for light tapering.

One of the most important functions of light guide WG106 is to confine incident light inside pixel area and taper wavelength-dependent portions to photodetectors D101, D102, and D103. The number of photodetectors could be as many as required to achieve successful color processing of acquired pixel array data. Compared to "integral" detector D110, which measure "integral" colors light energy, photodetectors D101, D102, D103 could be called "color" photodetectors because they detect light after color dependent tapering. FIG. 1 shows that inside light guide incident light is tapered into the color light C1 which is detected by photodetector D101, and respectively color light C2 is detected by D102 and color light C3 is detected by D103.

Light guide WG106 is formed between semiconductor surface S101 and metal layer R105. There might be numerous embodiments of Light guide architecture. One of such embodiments is that where light guide "core" material is semiconductor oxide, like $SiO_2$ or SiO, which is located between semiconductor surface S101 and metal surface R105. In this particular example the refraction index of $SiO_2$ is less than that of bulk silicon. Therefore, this light guide is not designed to hold light inside, but instead it is designed to loose light as it propagates through the light guide. This light guide has metal surface on the top and the only way for light to leave light guide is to go in the volume of bulk silicon, where it is detected by photodetectors D101, D102, ..., D110. The subsequent embodiments shown on FIGS. 3 and 4 describe light guide where "core" material refraction index might be greater or less than "cladding" layers in the vicinity of semiconductor surface.

The principle of tapering light inside light guide is based on multiple phenomena. Taking into account the obvious fact that different color light has different wavelength, and gradually adjusting distance between semiconductor surface S101 and metal layer R105 close enough to light wavelength, it is possible to achieve condition that longer wavelength light is "pushed into" bulk semiconductor more than shorter wavelength, and that would cause different tapering ratio for shorter and longer wavelengths. The other fact to consider is that light absorption coefficient inside semiconductor depends on wavelength, and that factor would affect tapering efficiency also. Further in this disclosure additional examples are illustrated to show various approaches how to manage tapering ratio by means of placing special structures or featured elements inside the light guide.

Figure 2:
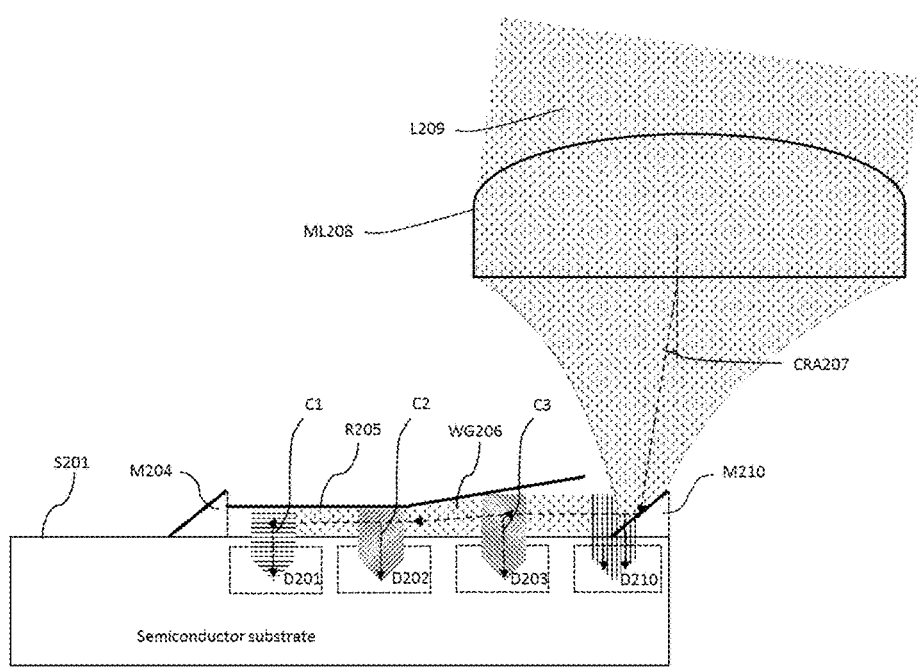
FIG. 2. Color pixel with micro-lens ML208 illustrating geometry of light focusing and directing into light guide WG206. The portion of light guide top metal surface R205 is tilted toward the semiconductor surface S201. C1, C2, C3 denotes different light colors. D201, D202, D203 are photodetectors.

In the embodiment illustrated on FIG. 2 the light guide WG206 has tilted metal surface R205, where a tilted and parallel portions are selected in such way that it gives optimized color separation of light tapered into photodetectors D201, D202, and D203. If distance between metal layer and semiconductor surface varies then light is forced to propagate inside semiconductor, and this effect is wavelength sensitive. The ratio of lengths of tilted portion of surface R205 and parallel portion of surface R205 is selected during tapering design procedure according to specified goal for color tapering ratio, and it could be any fractional number from 0 to 1, where 0 means no tilting, and 1 means all surface is tilted.

In addition to flat and tilt profiles of light guide metal surface, there are other possibilities of profiling, which include concave and convex surfaces. Such profiles selected to achieve desired and optimized color tapering operation.

Figure 3:
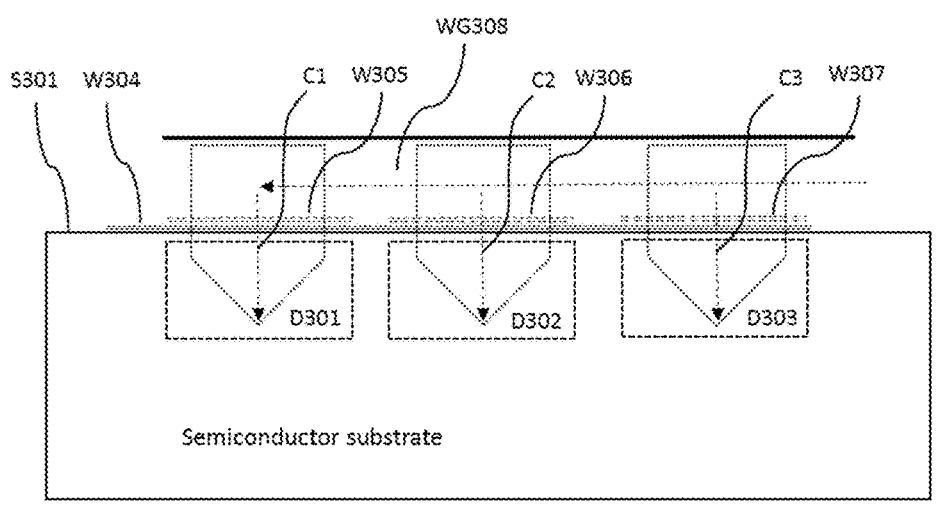
FIG. 3. Light guide WG308 exhibits multilayer structures W304 common for all photodetectors, and multilayer structures W305, W306, W307 specific for each photodetector, these structures are located above semiconductor surface S301. C1, C2, C3 denote different light colors. D301, D302, D303 are photodetectors.

Light guide WG308 shown on FIG. 3 has special structures located on semiconductors surface S301 or under this surface. Particularly, in this embodiment for each photodetector there are multilayer structures W305, W306 and W307 located higher than the surface of semiconductor S301. The other embodiment on FIG. 4 the multilayer structures W405, W406 and W407 are located lower than the semiconductor surface S401 for each photodetector.

The purpose of such multilayer structures is to engineer color light tapering into photodetectors. Structures W304 are multilayer structures which are common for multiple photodetectors, while multilayer structures W305, W306, W307 are separately engineered for each photodetector. The operation of multilayer structures are based on interference of light each particular color inside this structure in such way that enhances desired color light tapering. For example, due to interference light of particular color would be held inside light guide, or on the contrary, the bigger portion of light of the other color would penetrate inside semiconductor surface and be detected by photodetectors.

Figure 4:
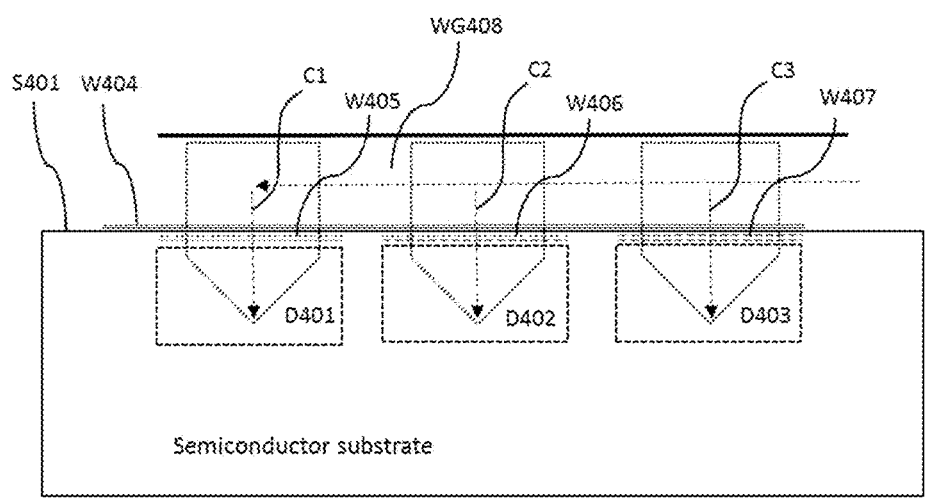
FIG. 4. Light guide WG408 exhibits specific for each photodetector multilayer structures W405, W406, W407 located below semiconductor surface S401.

The other essential function of multilayer structures displayed on FIG. 3 and FIG. 4 is to provide desired ratio between refraction index $n_0$ of light guide "core" and refraction indexes $n_1, n_2 \ldots$ of layers in multilayer structure. As mentioned previously, $n_0$ usually is less than refraction index of semiconductor $n_s$ (see other references 2). But positioning multilayer structure allows to achieve condition $n_0 > n_i$, where $n_i$ is one of indexes is the set $n_1, n_2 \ldots$ This condition is usually used for designing waveguides and achieving low extinction ratio if required. Selection the ratio between refraction indexes is one of the basic principles of performing customization and optimization of multilayer structure performance.

Figure 5:
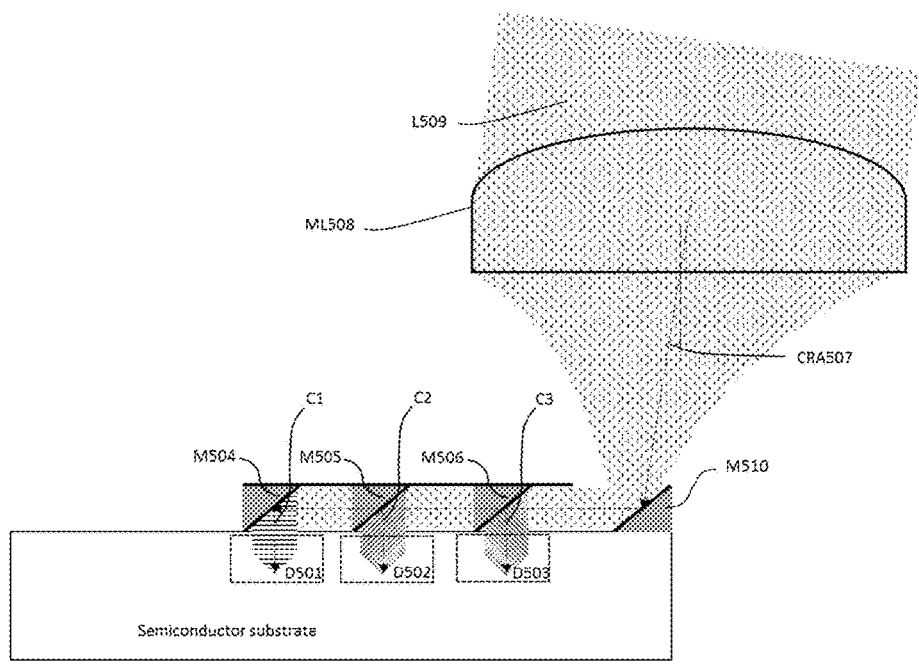
FIG. 5. Color light tapering from the light guide to photodetectors. This embodiment shows tapering performed by means of specially designed dichroic mirrors M504, M505, M506 positioned opposite to each color photodetector to reflect light of selected color.

The other embodiment to engineer color light tapering from light guide to photodetectors in shown on FIG. 5. In the light guide opposite to each color photodetector specially designed dichroic mirrors M504, M505, M506 positioned to reflect light of selected color to be detected by this photodetector. This scheme also represents claimed tapering method where tapering is implemented by light reflections from dichroic mirrors. Residual light which is not reflected by the mirrors M505 and M506 passes through these mirrors and is used for tapering on the next taper stages. The last stage M504 might reflect all residual light and might have some protection to prevent residual light from propagating to the next pixel. Such protection might be implemented as positioning of absorbing material in the light guide or additional mirror to reflect light backwards.

Figure 6:
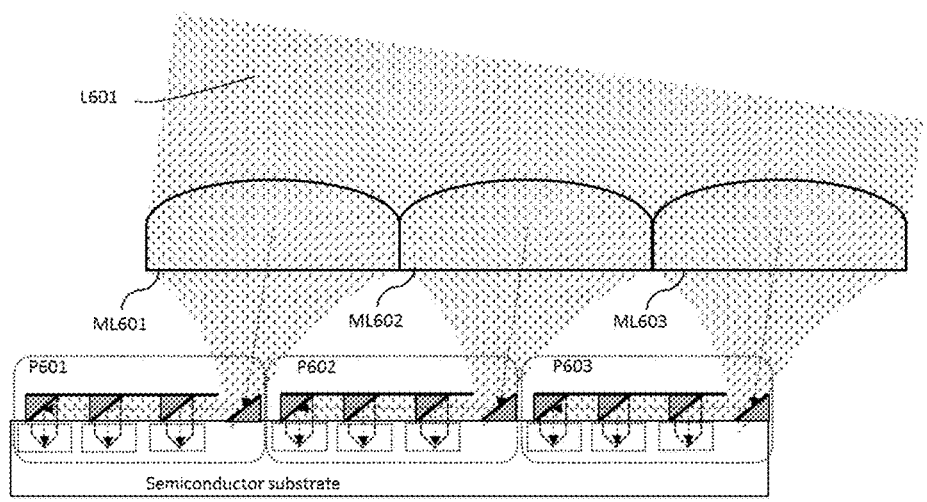
FIG. 6. Multiple pixels with color tapering light guides positioned one next to another.

FIG. 6 shows multiple pixels P601, P602, P603 positioned one to the next of the other with color tapering light guides, photodetectors, and corresponding micro-lenses ML601, ML602, ML603. Light guides in this embodiment are aligned along the same line, but it might also be different embodiments, where each next pixel light guide is parallel shifted in horizontal direction complementary to particular layout geometry. Usually pixels in image sensors contain numerous electrical components, like transistors and circuitry with multiple semiconductor layers and metal interconnects between them (see Other references #1). Such components are not discussed here because they are beyond the scope of this disclosure.

Abbreviations and Terms

CFA—Color Filter Array;
IR—infrared;
UV—ultraviolet;
Light color—term corresponds to specific range of light wavelengths, which can include IR, visible, UV and other range of electromagnetic waves spectrum where photodetector sensitivity is; and similar term Color light means light of specific wavelength range. Specifically, instead of color, more deterministic terms can be used, like red light corresponds to light wavelengths in the vicinity of visible red color, and similar meaning for green and blue light;
Light Color Components—Term Used to Specify Light of Selected Colors;
Color pixel array, color pixel(s)—terms used to describe pixels which are capable of and used for detection of light of different colors;
Photodetector Color—Term Indicating that Photodetector is Used for Detection Specific Light Color;
CMOS—complementary metal oxide semiconductor;
Light guide—designed structure described in this patent;
"Integral" photodetector—photodetector used to measure light energy for all colors;
Dichroic mirror—optical element used to split light such way that one portion having some color set is passing through, and the other portion having other color set is reflecting.

What is claimed is:

1. An imaging device with pixel array including color pixels, wherein each said color pixel comprises:
a micro-lens used to collect and focus light into small area inside said pixel;
an entry element located in the focus of said micro-lens, characterized in that, the entry element is used to re-direct light for tapering;
a light guide wherein light is directed after passing said entry element, characterized in that, said light guide is filled with light transparent material oriented along a semiconductor substrate surface, and said light guide is used to taper different light color components thus performing color separation;
multiple photodetectors receiving said tapered light thus performing light detection.

2. The imaging device of claim 1, wherein said light guide is located between said semiconductor substrate surface and a metal layer, characterized in that, said metal layer is located above said light guide horizontally on the same distance from semiconductor surface for all length of said light guide, or said metal layer portions are profiled in the vicinity of horizontal orientation, including tilt, concave, and convex profiles used to achieve desired light tapering operation.

3. The imaging device of claim 1 or 2, wherein each said color pixel has color specific multilayer structures located between said light guide and each said photodetector, characterized in that, said multilayer structures perform light color components tapering from light guide into each said photodetector, and said multilayer structures include combination of layers which are common for all said photodetectors and layers which are color specific for each photodetector color type.

4. The imaging device of claim 1 or 2, wherein said light guide includes tilted dichroic mirrors used to reflect desired light color components to correspondent said photodetectors thus performing light tapering and detection.

5. A method of separating and detecting light color components comprising:
   the imaging device of claim 1;
   tapering and separating light along the length of the light guide of each color pixel into color components, characterized in that, said separated color components have different light color spectrum, and said light color separation occurs during light propagation through the light guide due to physical properties of said light guide;
   detecting said separated light components using photodetectors of said imaging device, characterized in that, said photodetectors are positioned under the light guide in such way that selection of desired separated light components is defined by positions of said photodetectors.

* * * * *